United States Patent
Francis

(10) Patent No.: US 12,040,766 B2
(45) Date of Patent: Jul. 16, 2024

(54) WIDEBAND DIGITAL STEP ATTENUATOR AND BUFFER CIRCUITRY FOR A RECEIVER SYSTEM

(71) Applicant: XILINX, INC., San Jose, CA (US)

(72) Inventor: Roswald Francis, Kildare (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/871,699

(22) Filed: Jul. 22, 2022

(65) Prior Publication Data
US 2024/0030898 A1     Jan. 25, 2024

(51) Int. Cl.
*H03H 11/24*        (2006.01)
*H03K 19/0175*      (2006.01)

(52) U.S. Cl.
CPC ... *H03H 11/245* (2013.01); *H03K 19/017509* (2013.01)

(58) Field of Classification Search
CPC ......... H03H 11/245; H03K 19/017509; H03K 19/00346; H03K 19/017545; H04Q 2213/1319; H04Q 11/0442; H04Q 2213/13305; H03F 1/223; H03F 1/26; H03F 1/3205; H03F 1/52; H03F 2200/165; H03F 2200/168; H03F 2200/171; H03F 2200/294; H04B 1/123; H04B 1/16; H04B 1/18; H04B 1/40; H04B 1/406; H04L 25/0274; H04L 25/0282; H04L 25/03; H04L 25/03031; H04L 25/03057; H04L 25/10
See application file for complete search history.

(56) References Cited

U.S. PATENT DOCUMENTS

| | | | | |
|---|---|---|---|---|
| 7,085,372 B1* | 8/2006 | Heise | ................... | H04L 25/0274 379/400 |
| 8,947,840 B1* | 2/2015 | Milirud | ................... | H02H 9/046 361/56 |
| 11,063,602 B1* | 7/2021 | Bodnar | ................... | H03M 1/08 |
| 2008/0151929 A1* | 6/2008 | Uhlemann | ......... | H04Q 11/0442 370/493 |
| 2015/0349722 A1* | 12/2015 | Wang | ....................... | H04B 1/40 330/295 |
| 2019/0103839 A1* | 4/2019 | Lee | .......................... | H03F 3/193 |

FOREIGN PATENT DOCUMENTS

WO    WO-2019078994 A1 *   4/2019   ......... H01L 27/0255

* cited by examiner

*Primary Examiner* — Lincoln D Donovan
*Assistant Examiner* — Tyler J Pereny
(74) *Attorney, Agent, or Firm* — Patterson + Sheridan, LLP

(57) ABSTRACT

Attenuation circuitry for a wireless receiver system receives and attenuates an input signal. The attenuation circuitry includes an input pin, coil circuitry, capacitor network circuitry, and inverter circuitry. The input pin receives the input signal. The coil circuitry is electrically connected to the input pin, receives the input signal from the input pin, and outputs an adjusted signal from the input signal. The capacitor network circuitry is electrically connected to the coil circuitry. The capacitor network circuitry receives the adjusted signal from the coil circuitry, and outputs an attenuated signal from the adjusted signal. The inverter circuitry is electrically connected to the capacitor network circuitry. The inverter circuitry receives the attenuated signal and generates an output signal from the attenuated signal. The output signal is output from the attenuation circuitry via an output inductor.

20 Claims, 8 Drawing Sheets

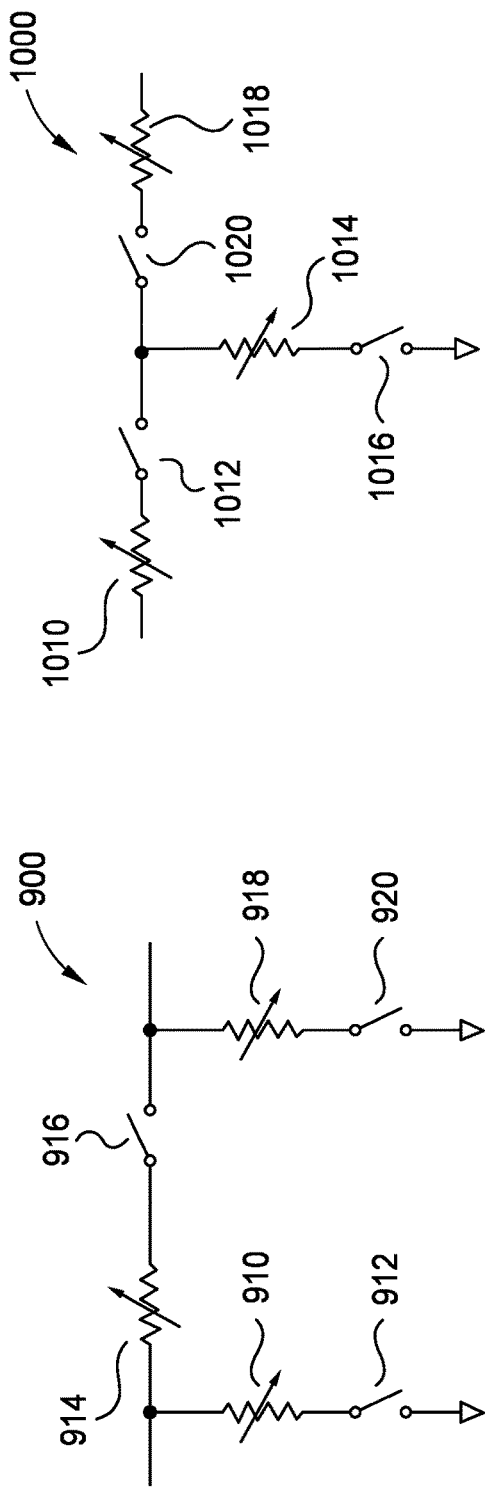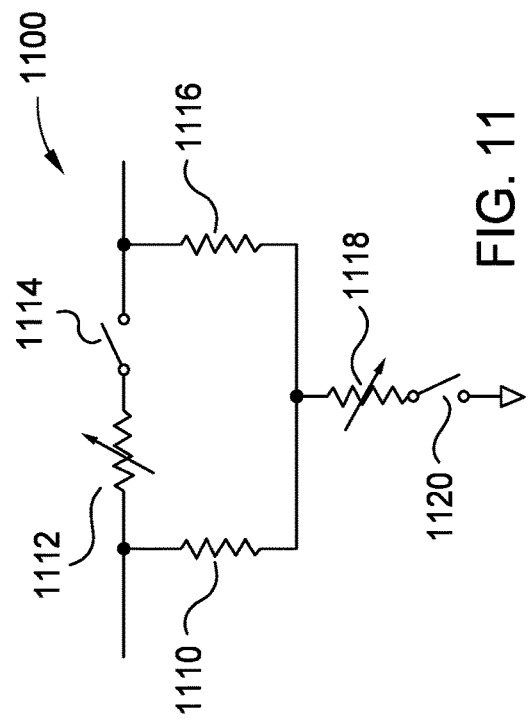
FIG. 10
FIG. 11
FIG. 9

WIDEBAND DIGITAL STEP ATTENUATOR AND BUFFER CIRCUITRY FOR A RECEIVER SYSTEM

TECHNICAL FIELD

Examples of the present disclosure generally relate to a wireless receiver system, and, in more particular to, wideband attenuation and buffer circuitry of a wireless receiving system having improved linearity, noise performance, and power supply rejection ratio.

BACKGROUND

Wireless receiver systems receive and process radio frequency (RF) signals. A wireless receiver system converts a received RF signal from an analog domain to a digital domain for processing by analog-to-digital converter (ADC) circuitry. The wireless receiver system includes an antenna that receives the RF signal and a bandpass filter that filters the received signal. The filtered signal is amplified and then attenuated to ensure that the dynamic range of the ADC circuitry is not exceeded. As the filtered signal includes both the signal of interest and blocker signals (e.g., noise or interference), the filtered signal can exceed the dynamic range of the ADC circuitry, saturating the ADC circuitry and introducing errors within the wireless receiver system.

In many typical wireless receiver systems, digital step attenuator (DSA) circuitry is used to attenuate the filtered signal. The DSA circuitry attenuates the filtered signal such that the ADC circuitry is able to convert and produce valid digital codes (signals). Generally, wireless receiver systems employ discrete, standalone, DSA circuitry that is external from the integrated circuit (IC) chip that includes the other elements within the wireless receiver systems. For example, the DSA circuitry is separate from an IC chip having the ADC circuitry, digital down conversion circuitry, and signal processing circuitry of the wireless receiver systems. The ADC circuitry, digital down conversion circuitry, and signal processing circuitry may be included within a system-on-chip (SoC) that is electrically connected to, but does not include, the DSA circuitry.

The use of discrete components such as the discrete DSA circuitry increases overall manufacturing cost of the corresponding wireless receiver system. To reduce manufacturing costs of the wireless receiver systems, the DSA circuitry may be integrated within the IC chip that includes the ADC circuitry, digital down conversion circuitry, and signal processing circuitry of a wireless receiver system. However, current RF compliant fabrication methods and DSA circuitry architectures make integrating the DSA circuitry within the IC chip that includes the ADC circuitry, digital down conversion circuitry, and signal processing circuitry of a wireless receiver system difficult. Further, as the frequency requirement for wireless receiver systems increases (e.g., greater than 10 GHz), the linearity of the wireless receiver systems needs to increase accordingly.

Thus, an improved DSA circuitry architecture is needed to allow DSA circuitry to be integrated within the IC chip including the ADC circuitry, digital down conversion circuitry, and signal processing circuitry of a wireless receiver system to reduce manufacturing costs and to improve the linearity of the wireless receiver system.

SUMMARY

In one example, an attenuator includes attenuation circuitry. The attenuation circuitry includes an input pin, coil circuitry, capacitor network circuitry, and inverter circuitry. The input pin receives an input signal. The coil circuitry is electrically connected to the input pin, receives the input signal from the input pin, and outputs an adjusted signal from the input signal. The capacitor network circuitry is electrically connected to the coil circuitry, receives the adjusted signal from the coil circuitry, and outputs an attenuated signal from the adjusted signal. The inverter circuitry is electrically connected to the capacitor network circuitry, receive the attenuated signal, and generates an output signal from the attenuated signal. The output signal is output from the attenuation circuitry via an output inductor.

In one example, a receiver system includes attenuation circuitry, and an analog-to-digital converter (ADC) circuitry. The attenuation circuitry include an input pin, coil circuitry, capacitor network circuitry, and inverter circuitry. The input pin receives an input signal. The coil circuitry electrically is connected to the input pin, receives the input signal from the input pin, and outputs an adjusted signal from the input signal. The capacitor network circuitry is electrically connected to the coil circuitry, receive the adjusted signal from the coil circuitry, and outputs an attenuated signal from the adjusted signal. The inverter circuitry is electrically connected to the capacitor network circuitry, receives the attenuated signal, and generates an output signal from the attenuated signal. The output signal is output from the attenuation circuitry via an output inductor. The ADC circuitry is electrically connected to an output of the attenuation circuitry.

In one example, an attenuator includes differential attenuation circuitry. The differential attenuation circuitry includes a first path and a second path. The first path includes a first input pin, first coil circuitry, first capacitor network circuitry, and first inverter circuitry. The first input pin receives a first signal of a differential input signal. The first coil circuitry is electrically connected to the first input pin, and outputs a first adjusted signal. The first capacitor network circuitry is electrically connected to the first coil circuitry, and outputs a first attenuated signal. The first inverter circuitry is electrically connected to the first capacitor network circuitry, and generates a first output signal via a first inductor. The second path includes a second input pin, second coil circuitry, second capacitor network circuitry, and second inverter circuitry. The second input pin receives a second signal of the differential input signal. The second coil circuitry is electrically connected to the second input pin, and outputs a second adjusted signal. The second capacitor network circuitry is electrically connected to the second coil circuitry, and outputs a second attenuated signal. The second inverter circuitry is electrically connected to the second capacitor network circuitry, and generates a second output signal via a second inductor. The first output signal and the second output signal are part of a differential output signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 9 illustrates a schematic circuit diagram of attenuation circuitry, according to some examples.

FIG. 10 illustrates a schematic circuit diagram of attenuation circuitry, according to some examples.

FIG. 11 illustrates a schematic circuit diagram of attenuation circuitry, according to some examples.

To facilitate understanding, identical reference numerals have been used, where possible, to designate identical elements that are common to the figures. It is contemplated that elements of one example may be beneficially incorporated in other examples.

DETAILED DESCRIPTION

A wireless receiver system receives and processes radio frequency (RF) signals. The wireless receiver system filters the received signal to remove unwanted signals, and converts the filtered signal from an analog domain to a digital domain for processing. A wireless receiver system includes attenuation circuitry that attenuates the filtered signal to ensure that the dynamic range of subsequent signal processing circuitry components is not exceeding, saturating those components. For example, a wireless receiver system includes analog-to-digital converter (ADC) circuitry that converts the RF signal from an analog signal domain to a digital signal domain. The attenuation circuitry attenuates the RF signal before it is received by the ADC circuitry such that the dynamic range of the ADC circuitry is not exceeded.

The attenuation circuitry may be digital step attenuator (DSA) circuitry that attenuates a received signal. The DSA circuitry may include multiple "steps" of attenuation than can be used to attenuate the received signal such that the dynamic range of the ADC circuitry is not exceeded. For example, the DSA circuitry may attenuate a received signal by steps of at least 1 dB. The separation between steps may be the same or different. In one example, the steps may be in a range of about 1 dB to about 30 dB, or greater.

As will be described in greater detail in the following, a wireless receiver system further includes digital down conversion (DDC) circuitry and digital signal processing (DSP) circuitry connected to the output of the ADC circuitry. To reduce manufacturing costs, the ADC circuitry, the DDC circuitry, and the DSP circuitry are included within the same integrated circuit (IC) chip. For example, the ADC circuitry, the DSP circuitry are implemented as part of a system-on-chip (SoC) device. To further reduce the manufacturing costs, the attenuator circuitry is integrated within the IC chip, and implemented as part of the SoC, that includes the ADC circuitry, the DDC circuitry, and the DSP circuitry.

Further, the attenuator circuitry described in the following has an improved architecture that allows the attenuator circuitry to be integrated within an IC chip with the ADC circuitry, the DDC circuitry, and the DSP circuitry of a wireless receiver system without negatively affecting the linearity of the wireless receiver system.

Figure 1:
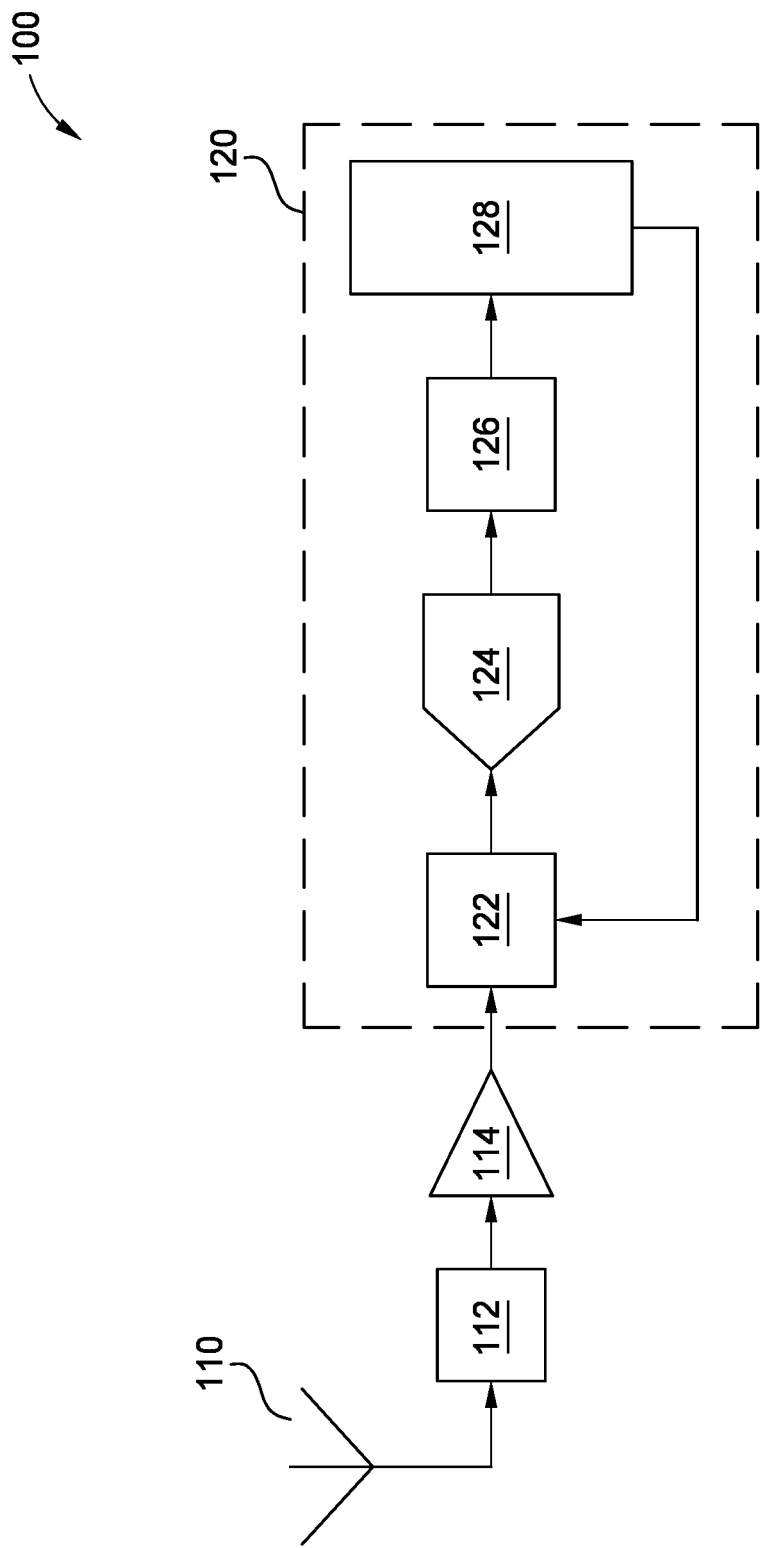
FIG. 1 is a block diagram of a wireless receiver system, according to some examples.

FIG. 1 illustrates a wireless receiver system 100, according to one or more examples. The wireless receiver system 100 includes an antenna 110, filter circuitry 112, amplifier circuitry 114, attenuator circuitry 122, ADC circuitry 124, DDC circuitry 126, and DSP circuitry 128. In one or more examples, the attenuator circuitry 122, the ADC circuitry 124, the DDC circuitry 126, and the DSP circuitry 128 is included within the IC chip 120. In one example, the IC chip 120 is an application specific IC device. In another example, the IC chip 120 is a programmable device. For example, the IC chip 120 is a field-programmable gate array (FPGA) device. In one or more examples, the IC chip 120 is a SoC device. Further, the IC chip 120 may include multiple interconnected IC chips. In such an example, the IC chips may be vertically stacked forming a three dimensional stack of IC chips.

The antenna 110 receives a radio frequency (RF) signal (e.g., an input signal). The antenna 110 outputs the received signal to the filter circuitry 112. The filter circuitry 112 may be a bandpass filter that passes signals having a frequency in a range of about 8 GHz to about 12 GHz. In other examples, other frequency ranges may be used. Further, in one or more examples, the filter circuitry 112 may pass signals having a frequency that is less than about 8 GHz and/or greater than about 12 GHz.

The filter circuitry 112 generates a filtered signal from the received input signal. The filtered signal is output to the amplifier circuitry 114. The amplifier circuitry 114 receives the filtered signal and generates an amplified signal. The amplifier circuitry 114 may be low noise amplifier circuitry.

The filtered signal includes the wanted signal and interference (e.g., noise or blocker signal). The magnitude of the interference may be greater than the magnitude of the wanted signal. The amplifier circuitry 114 amplifies the magnitude of the filtered signal, increasing the magnitude of both the wanted signal and the interference signal. In one example, the amplifier circuitry 114 amplifies the magnitude of the filtered signal by gain of about 30 dB to about 40 dB. In another examples, the amplifier circuitry 114 amplifies the magnitude of the filtered signal by gain of less than about 30 dB and/or greater than about 40 dB.

The amplifier circuitry 114 outputs the amplified signal, which is received by the attenuation circuitry 122. The attenuation circuitry 122 receives the amplified signal and attenuates the amplified signal, reducing the magnitude of the amplified signal to be within the dynamic range of the ADC circuitry 124. In one example, the attenuation circuitry 122 is DSA circuitry. The attenuation circuitry 122 attenuates the amplified signal by one or more steps. The steps may be 1 dB, 4 dB, 5 dB, 6 dB, 30 dB, or more. Each step may correspond to a fixed amount of attenuation.

The attenuation circuitry 122 reduces the magnitude of the wanted signal and the interference within the amplified signal. For example, for an amplified signal having a 1 mV peak-to-peak wanted signal and a 10 V peak-to-peak interference signal, the attenuation circuitry 122 generates an attenuated signal having a 100 uV peak-to-peak wanted signal and a 1 V peak-to-peak interference signal.

The attenuated signal is output by the attenuation circuitry 122 and received by the ADC circuitry 124. The ADC circuitry 124 converts the attenuated signal from an analog domain to a digital domain. The ADC circuitry 124 outputs a digital signal generated from the attenuated signal. The digital signal is received by the DDC circuitry 126.

In one or more examples, the attenuation circuitry 122 functions as a buffer between the ADC circuitry 124 and external elements (e.g., circuit elements external to the IC chip 120), mitigating the effects of external interference on the functions of the ADC circuitry 124. Further, the attenuation circuitry 200 may mitigate the effects of ADC circuitry 124 (e.g., switching noise injection) on the external circuitry (e.g., circuitry external to the IC chip 120).

Figure 2A:
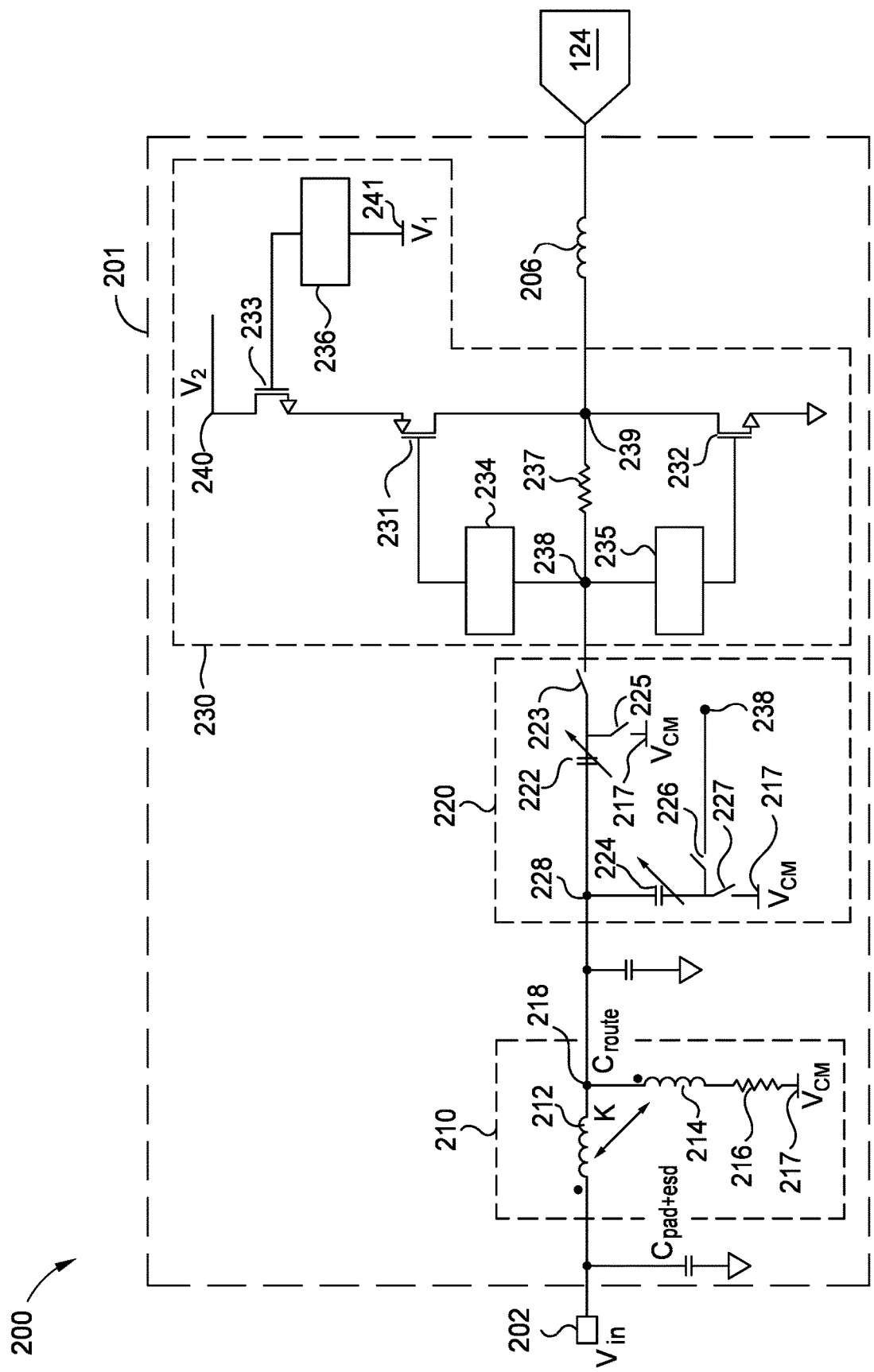
FIG. 2A illustrates a schematic circuit diagram of attenuation circuitry, according to some examples.

FIG. 2A is a schematic illustration of an attenuator 200 including attenuation circuitry 201, according to one or more examples. The frequency response of the attenuation circuitry 201 has a bandpass, with a lower cuttoff frequency, an upper cuttoff frequency. The bandwidth of the frequency response corresponds to the area of the frequency response between the lower cuttoff frequency (e.g., corner frequency) and the upper cuttoff frequency. In one example, the upper cuttoff frequency is about the 3 dB bandwidth of the attenuator circuitry 201. Further, the lower cuttoff frequency is based on the feedback resistance (e.g., the resistance of resistor 237) of the attenuation circuitry 201.

The attenuation circuitry 201 includes coil circuitry 210, capacitor network circuitry 220, and inverter circuitry 230. The attenuation circuitry 201 further includes input node (pin) 202 that receives the input signal $V_{in}$. The input signal $V_{in}$ is an amplified signal output by the amplifier circuitry 114 of FIG. 1. Further, the capacitance $C_{pad+esd}$ is the pad capacitance and electrostatic discharge (esd) protection device(s) capacitance at the input node 202.

The coil circuitry 210 is electrically connected to the input node 202. In one example, the coil circuitry 210 is T-coil circuitry. The output of the coil circuitry 210 is electrically connected to the capacitor network circuitry 220. The routing between the coil circuitry 210 and the capacitor network circuitry 220 has a capacitance Croute. The output of the capacitor network circuitry 220 is electrically connected to the input of inverter circuitry 230 via the switch 223. The output of the inverter circuitry 230 is electrically connected to the ADC circuitry 124 via the inductor 206. The inductor 206 has an inductance of 150 pH. In other examples, the inductance of the inductor 206 is greater than or less than 150 pH.

The coil circuitry 210 includes inductor 212, inductor 214, and resistor 216. The inductor 212 is connected between the input node 202 and the node 218. The inductor 214 is connected between the node 218 and the resistor 216. The resistor 216 is connected between the inductor 214 and a node 217 that receives the common mode voltage signal $V_{cm}$. The inductors 212 and 214 are coupled to each other via the coupling coefficient K. In one example, the coupling coefficient is 0, and the inductors 212 and 214 may be considered to be connected in series and shunt (parallel) with respect to the input signal $V_{in}$. Further, in an example where the coupling coefficient K is greater than 0 (positive) or less than 0 (negative), the coil circuitry 210 is configured as T-coil circuitry.

The coil circuitry 210 increases the bandwidth of the attenuation circuitry 201. For example, the coil circuitry 210 aids in flattening (e.g., improving) the signal response of the attenuation circuitry 201. In one example, the coil circuitry 210 improves the return loss of the capacitor network circuitry 220. The inductor 212 and the inductor 214 may have the same inductance. In another example, the inductance of the inductor 212 is greater than or less than the inductance of the inductor 214. Further, in one example, the inductance of the inductors 212 and 214 is selected to flatten the signal response of the attenuation circuitry 122 and improves return loss of the capacitor network circuitry 220. In one or more examples, the inductance of the inductors 212 and 214 is about 1 nH. In other examples, the inductance of the inductor 212 and/or 214 is greater than or less than 1 nH. The resistor 216 has a resistance of about 50 ohms.

The capacitor network circuitry 220 includes capacitors 222 and 224, and switches 223, 225, 226, and 227. The capacitor 222 is connected to the node 228, to the node 217 via switch 225, and to the node 238 via switch 223. The capacitor 224 is connected to the node 228, to the node 217 via the switch 227 and to the node 238 via the switch 226.

The capacitor 222 forms the forward looking path from the node 228, and the capacitor 224 forms the bypass path from the node 228. The capacitors 222 and 224 attenuate the input signal $V_{in}$. The capacitance of capacitor 222 is $C_1$, the capacitance of capacitor 224 is $C_2$, and the combined capacitance $(C_1+C_2)$ is C. The attenuation "A" is based on a ratio of the combined capacitance C to the capacitance $C_1$, or $A=C/C_1$. The attenuation can be adjusted by adjusting the capacitance C relative to the capacitance $C_1$ or the capacitance $C_1$ relative to the capacitance C. In one or more examples, increasing the capacitance C negatively affects (e.g., disturbs) the input signal $V_{in}$. Accordingly, to adjust the amount of attenuation without negatively affecting the input signal $V_{in}$, the capacitance $C_1$ is adjusted relative the capacitance C. For example, increasing the capacitance $C_1$ while maintaining the capacitance C decreases the attenuation, and decreasing the capacitance $C_1$ while maintaining the capacitance C increases the attenuation.

In one example, to adjust the capacitance $C_1$ while maintaining the capacitance C, the capacitance $C_2$ is adjusted proportionally. For example, increasing the capacitance $C_1$ decreases the capacitance $C_2$ proportionally, and decreasing the capacitance $C_1$ increases the capacitance $C_2$ proportionally. In one or more examples, to increase the capacitance $C_2$, the capacitance of the capacitor 224 may be increased. In other examples, to increase the capacitance $C_2$, additional capacitors may be placed in parallel with the capacitor 224 such that the combined capacitance $C_2$ is increased. As is described in further detail with regard to FIG. 2B, in such examples, the capacitors 222 and 224 are capacitor arrays 222' and 224' that have multiple capacitors may be selectively enabled or disabled to increase or decreased the capacitances $C_1$ and $C_2$.

In once example, the capacitance C is 200 fF. The capacitance $C_1$ is 20 fF, and the capacitance $C_2$ is 180 fF. Accordingly, the amount of attenuation A is 200/20 is a factor of 10 (e.g., 20 dB). In other examples, other capacitance values may be used to increase or decrease the amount of attenuation.

Figure 2B:
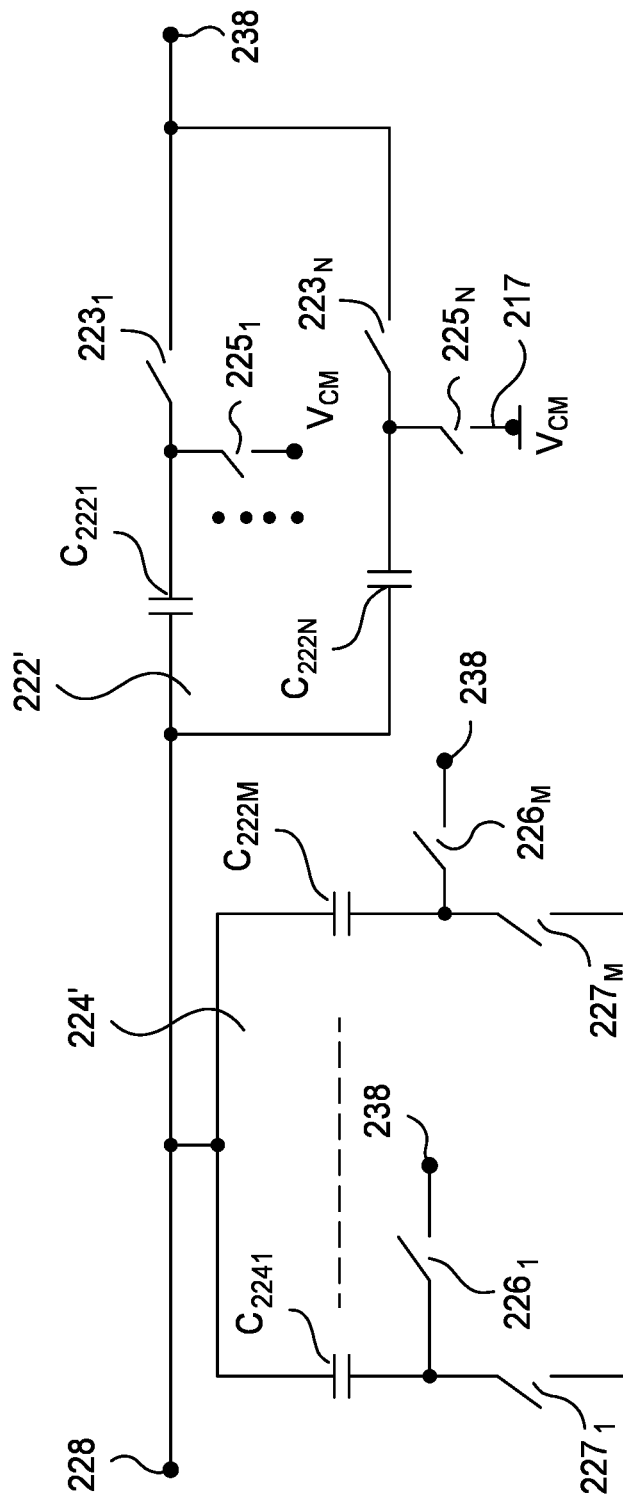
FIG. 2B illustrates a schematic circuit diagram of capacitor arrays, according to some examples.

In one or more examples, the capacitors 222 and 224 are capacitor arrays (e.g., capacitor arrays 222' and 224' of FIG. 2B). The attenuation circuitry 201 creates multiples steps of attenuation by varying the capacitance of the capacitor arrays 222' and 224'. As illustrated in FIG. 2B, the capacitor array 222' includes capacitors $C_{222}$ ($C_{2221}$-$C_{222N}$). Further, the capacitor array 222' includes switches 223 ($223_1$-$223_N$) and switches 225 ($225_1$-$225_N$). N is two or more. Each of the capacitors $C_{222}$ is connected to the node 238 via a respective one of the switches 223 and to the node 217 via a respective one of the switches 225. In one specific example, the capacitor $C_{222N}$ is connected to the node 238 by closing the switch $223_N$ and disconnected from the node 217 opening the switch $225_N$. Further, the capacitor $C_{222N}$ is connected to the node 217 by closing the switch 225$_N$ and disconnected from the node 238 opening the switch 223$_N$.

The capacitor array 224' includes capacitors C$_{224}$ (C$_{224_1}$-C$_{224_Q}$. Further, the capacitor array 224' includes switches 226 (226$_1$-226$_M$) and 227 (227$_1$-227$_M$). M is two or more. In one example, M is greater than N. In another example, M is equal to N or less than N. Each of the capacitors C$_{224}$ is connected to the node 238 via a respective one of the switches 226 and to the node 217 via a respective one of the switches 227. In one example, the capacitor C$_{222M}$ is connected to the node 238 by closing the switch 226$_M$ and disconnected from the node 217 opening the switch 227$_M$. Further, the capacitor C$_{222M}$ is connected to the node 217 by closing the switch 227$_M$ and disconnected from the node 238 opening the switch 226$_M$.

In one example, connecting capacitors C$_{222}$ and/or C$_{224}$ to the node 238 by closing the switches 223 and/or 226, increases the capacitance between the node 228 and the node 228 (e.g., increases the value of capacitance C$_1$). Further, connecting capacitors C$_{222}$ and/or C$_{224}$ to the node 217 by closing a respective one of the switches SW$_{11}$ or SW$_{21}$, increases the capacitance between the node 228 and the node 238.

In one or more examples, the amount of attenuation of the attenuation circuitry 201 is increased or decreased by adjusting the capacitance values of capacitor array 222' and the capacitor array 224' with respect to each other. In one example, the capacitance of the capacitor array 222' is C1 and the capacitance of the capacitor array 224' is C2. To increase the attenuation of the attenuation circuitry 201, one or more capacitors from capacitor array 222' are moved to the capacitor array 224' by opening one or more of the switches 223 and closing one or more of the switches 225. To decrease the attenuation of the attenuation circuitry 201, one or more of capacitors from capacitor array 224' are moved to the capacitor array C1 by opening one or more of the switches 227 and closing one or more of the switches 226. In both cases, e.g., increasing or decreasing the attenuation, the combined capacitance of C1 and C2 (C1+C2=C), and remains constant (e.g., C remains constant). The amount of capacitor switching can be determined from A=C/C1.

The capacitor network circuitry 220 is connected to the inverter circuitry 230 via the switch 223. The inverter circuitry 230 includes transistors 231, 232, and 233, level shifter circuitries 234, 235, and 236, and resistor 237. The level shifter circuitry 234 is connected between the node 238 and the gate of the transistor 231. The level shifter circuitry 234 increases or decreases the voltage level of the signal at node 238 (e.g., the attenuated output signal of the capacitor network circuitry 220). The transistor 231 is a p-channel metal-oxide semiconductor (PMOS) transistor. The source of the transistor 231 is connected to a source of the transistor 233. The drain of the transistor 231 is connected to the node 239. In one example, the polarity of the signal at node 239 is opposite the polarity of the signal at node 228.

The transistor 233 is an n-channel metal-oxide semiconductor (NMOS) transistor. The gate of the transistor 233 is connected to the level shifter circuitry 236. The level shifter circuitry 236 receives and adjusts the signal V$_1$ received from the node 241. In one example, the signal V$_1$ has the same magnitude and opposite polarity of the signal at the node 238. In another example, the signal V$_1$ has the same magnitude and polarity of the signal at the node 239. In one example, the signal V$_1$ is an attenuated version of the signal at node 239 without any sign change. The level shifter circuitry 236 drives the gate of the transistor 233 with the adjusted signal. The drain of the transistor 233 is connected to a node 240 that receives the power supply V$_2$.

The level shifter circuitry 235 receives and adjusts the voltage level of the signal at the node 238 (e.g., the attenuated output signal of the capacitor network circuitry 220). The output signal of the level shifter circuitry 235 has the same polarity as the output signal of the level shifter circuitry 234. The level shifter circuitries 234 and 235 are direct current (DC) shifting blocks. The level shifter circuitries 234 and 235 do not alter the signal voltages in magnitude or polarity. The level shifter circuitries 234 and 235 provide the appropriate DC bias voltages to the gates of the transistors 231 and 233, respectively. In one or more examples, the output signal of the level shifter circuitry 234 and the output signal of the level shifter circuitry 235 have the same magnitude.

The level shifter circuitry 235 is electrically connected to and drives the gate of the transistor 232. The transistor 232 is an NMOS transistor. The source of transistor 232 is connected to a node that receives a ground or other reference voltage. The drain of the transistor 232 is connected to the node 239. Accordingly, the drain of the transistor 231 is connected to the drain of the transistor 232 at the node 239.

The resistor 237 is connected between the node 238 and the node 239. The resistor 237 functions as a feedback resistor. The resistance value of the resistor 237 is selected such that the frequency response of the attenuation circuitry 201 has a lower cutoff frequency of about 0 Hz (e.g., direct current (DC)). In one example, resistance value of the resistor 237 is selected such that the frequency response of the attenuation circuitry 201 has a lower cutoff frequency that is less than about 100 Hz, about 1 MHz, 10 MHz, or 100 MHz.

The transistor 233 and the level shifter circuitry 236 function as a voltage regulator, or a power supply, driving the transistor 231. Accordingly, the inverter circuitry 230 includes an integrated voltage regulator. The transistor 233 and the level shifter circuitry 236 increases the transconductance of the transistors 231 and 232. For example, the transistor 233 and the level shifter circuitry 236 drives a negative signal onto the source of the transistor 231, making the signal driven onto the source of the transistor 231 a virtual ground for signal component, increasing the transconductance of the transistors 231 and 232. Further, in one or more examples, the drain of the transistor 233 is driven with a supply voltage signal by the node 240. In such examples, the transistor 233 mitigates changes in the supply voltage signal.

In one or more examples, the transistor 233 and the level shifter circuitry 236 improve the wide band linearity of the attenuator circuitry 201. For example, any distortion at the node 238 is also present at the input to the source of the transistor 231 and 233, and at the input of the gate of the transistor 231 with the same magnitude and phase. Accordingly, the current through the transistors 231 and 233 is not modulated by the distortion as the gate-source voltage (V$_{GS}$) of the transistors 231 and 233 does not contain effects of the distortion. Accordingly, the use of the transistor 233, the level shifter circuitry 236, and the transistor 231 improve the linearity of the attenuation circuitry 201 and the attenuator 200.

In one or more examples, the resistance value of the resistor 237 (e.g., feedback resistance R$_{fb}$) is selected such that the pole P1 of the frequency response of the attenuator circuitry 201 is about 1/(2*π*R$_{fb}$*C$_{gd}$)·C$_{gd}$ is equal to the sum of the parasitic capacitance between gate and drain of the transistor 231 and the transistor 232. $C_{gd}$ includes both layout parasitics and device capacitance of the attenuator circuitry 201.

Beyond the pole P1, the attenuator circuitry 201 circuit is an inverter amplifier with amplification determined by, gain $G_v=C/C_{gd}$, where $C=C_1+C_2$ and $C_{gd}$. In one example, for a unity gain amplifier (or buffer) $C=C_{gd}$.

The inverter circuitry 230 is electrically connected to the inductor 206. The output of the inverter circuitry 230 is output to the inductor 206. The inductor 206 provides output peaking, boosting the frequency response of the attenuator circuitry 201. The inductor 206 is electrically connected to an input of the ADC circuitry 124. For example, the inductor 206 outputs the attenuated signal from the attenuator circuitry 122 to the ADC circuitry 124.

In one example, an attenuator circuitry (e.g., attenuator circuitry 201) including capacitors (e.g., capacitors 222 and 224, or the capacitor arrays 222' and 224') has reduced noise as compared to an attenuator circuitry having a different topology, e.g., an attenuator circuitry including resistors instead of capacitors. Further, an attenuator circuitry including capacitors has improved precision in attenuation steps due to an inherent improved matching property of the capacitors within the IC design, linearity, and low circuit area, as compared to an attenuator circuitry having a different topology, e.g., an attenuator circuitry including resistors instead of capacitors.

Figure 3:
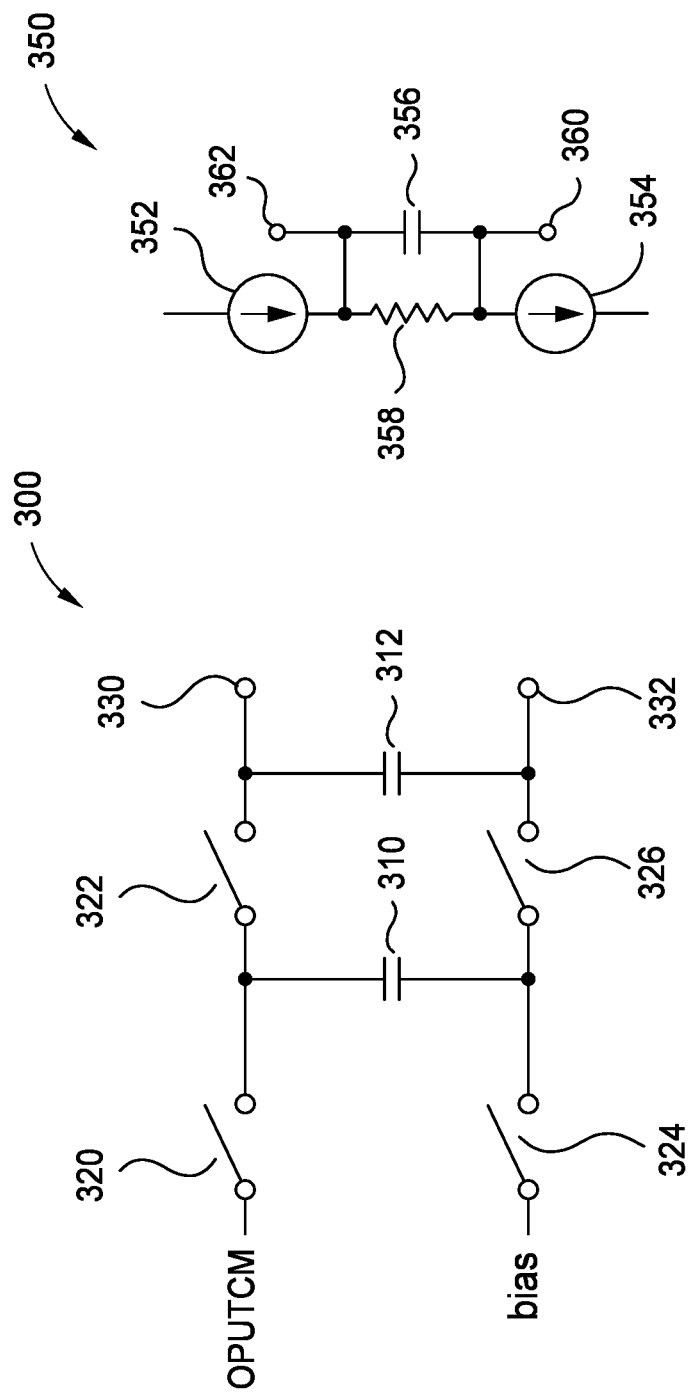
FIG. 3 illustrates a schematic circuit diagrams of level shifter circuitry, according to some examples.

FIG. 3 illustrates example circuit diagrams of level shifter 300 and level shifter 350. In one or more examples, the level shifter 300 or the level shifter 350 may be used as the level shifter circuitries 234, 235, and 236 of FIG. 2A. In other examples, the level shifter circuitries 234, 235, and 236 may have different architectures from that illustrated in FIG. 3.

The level shifter 300 is a switched capacitor level shifter and includes capacitors 310 and 312, and switches 320, 322, 324, and 326. The switch 320 is electrically connected between a node that receives the voltage signal OUTCM and the capacitor 310, and the switch 324 is electrically connected between a node that receives the voltage signal bias and the capacitor 310. The voltage signal OUTCM determines the output common mode of the node 239 in FIG. 2A. Stated another way, the inverter output common mode noise is set by the voltage signal OUTCM. The node that outputs the voltage signal OUTCM is the same as the node 217 that receives Vcm. Further, the switch 322 is electrically connected between the capacitor 310 and the capacitor 312, and the switch 326 is electrically connected between the capacitor 310 and the capacitor 312. Further, the capacitor 312 is connected between the input node 330 and the output node 332. The input node 330 receives an input signal, and the output node 332 outputs the output signal.

The level shifter 350 is a current multiplier level shifter and includes current sources 352 and 354, capacitor 356, and resistor 358. The resistor 358 is connected in parallel with the capacitor 356. The capacitor 356 is connected between the input node 360 and the output node 362. The current source 352 is electrically connected to the capacitor 356 and the resistor 358 and outputs a current to the capacitor 356 and 358. The current source 354 is electrically connected to the capacitor 356 and the resistor 358 and sinks a current received from the capacitor 356 and the resistor 358. The level shifter 350 receives an input signal via the input node 360 and outputs an adjusted signal via the output node 362.

Figure 4:
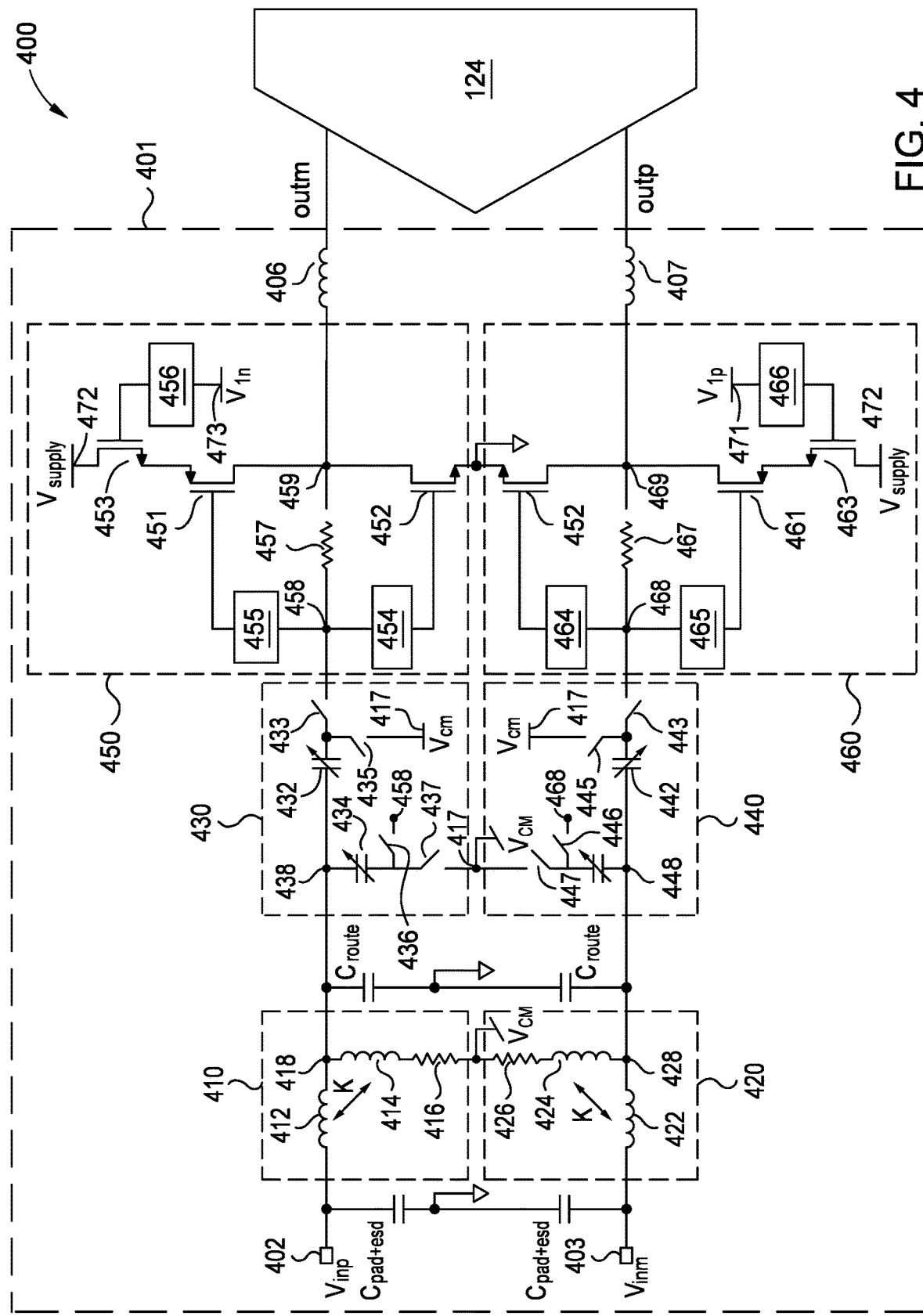
FIG. 4 illustrates a schematic circuit diagram of differential attenuation circuitry, according to some examples.

In one example, the attenuation circuitry 201 of FIG. 2A illustrates a single path, side, of a differential attenuation circuitry. FIG. 4 illustrates both paths of a differential attenuation circuitry 401 of an attenuator 400. The attenuation circuitry 401 includes a first path that includes coil circuitry 410, capacitor network circuitry 440, and inverter circuitry 450. The coil circuitry 410 is configured similar to the coil circuitry 210 of FIG. 2A. The capacitor network circuitry 440 is configured similar to the capacitor network circuitry 220 of FIG. 2A. The inverter circuitry 450 is configured similar to the inverter circuitry 230 of FIG. 2A.

The coil circuitry 410 is electrically connected to the input node 402. The input node 402 receives the input signal $V_{inp}$. The input signal $V_{inp}$ is one signal of a differential input signal. The coil circuitry 410 includes inductors 412 and 414 connected to the node 418, and the resistor 416. The inductors 412 and 414 are configured similar to the inductors 212 and 214 of FIG. 2A, respectively, and the resistor 416 is configured similar to the resistor 216 of FIG. 2A.

The output of the coil circuitry 410 is electrically connected to the capacitor network circuitry 430. The capacitor network circuitry 430 includes capacitor 432 connected to the node 458 via the switch 433 and the node 417 via the switch 435. Further, the capacitor network circuitry 430 includes capacitor 434 that is connected to the node 438 and to the node 417 via the switch 437 and the node 458 via the switch 436. The node 417 receives the common voltage signal $V_{cm}$. In one or more examples, capacitors 432 and 434 are capacitor arrays configured similar to the capacitor arrays 222' and 224' of FIG. 2B, respectively. Further, the switches 433, 435, 436, and 437 are configured similar to the switches 223, 225, 226, and 227 of FIG. 2A and FIG. 2B, respectively.

The output of the capacitor network circuitry 430 is electrically connected to the inverter circuitry 450. The inverter circuitry 450 includes transistors 451, 452, and 453, level shifter circuitries 454, 455, and 456, and resistor 457. The level shifter circuitry 455 is electrically connected to the node 458 and the gate of the transistor 451, and drives the gate of the transistor 451 with a level shifted signal that is based on the signal at the node 458.

The level shifter circuitry 456 is electrically connected to the gate of the transistor 453. The level shifter circuitry 456 receives the voltage signal $V_{1N}$ at the node 473 and generates a level shifted signal that is driven onto the gate of the transistor 453. The signal $V_{1N}$ is the voltage signal at the node 468. The drain of the transistor 453 is driven by the power supply $V_{supply}$ via the node 472.

The transistors 451, 452, and 453 are configured similar to the transistors 231, 232, and 233 of FIG. 2A, respectively. The level shifter circuitries 454, 455, and 456 are configured similar to the level shifter circuitries 234, 235, and 236 of FIG. 2A, respectively, and the resistor 457 is configured similar to the resistor 237 of FIG. 2A.

The output of the inverter circuitry 450 is electrically connected to the inductor 406. The inductor 406 is configured similar to the inductor 206. The output of the inductor 406 is electrically connected to the ADC circuitry 124. The inductor 406 outputs the output signal outm.

The second path of the differential attenuation circuitry 401 includes coil circuitry 420, capacitor network circuitry 440, and inverter circuitry 460. The coil circuitry 420 is configured similar to the coil circuitry 210 of FIG. 2A, however, while the coil circuitry 210 is driven between a positive voltage signal (e.g., the input signal $V_{in}$) and a common voltage signal $V_{cm}$ via the node 217, the coil circuitry 420 is driven between a negative voltage signal (e.g., the input signal $V_{inm}$) and the common voltage signal $V_{cm}$ at the node 417. The capacitor network circuitry 440 is configured similar to the capacitor network circuitry 220 of FIG. 2A. However, while the capacitor network circuitry 220 is driven between a positive voltage signal (e.g., the input signal $V_{in}$) and the common voltage signal $V_{cm}$, the capacitor network circuitry 440 is driven between a negative voltage signal (e.g., the input signal $V_{inm}$) and the common voltage signal $V_{cm}$. The inverter circuitry 460 is configured similar to the inverter circuitry 230 of FIG. 2A. However, the inverter circuitry 460 operates on an input signal the input signal $V_{inm}$ that is opposite in polarity from the input signal $V_{in}$ operated on by the inverter circuitry 230 of FIG. 2A.

The coil circuitry 420 is electrically connected to the input node 403. The input node 403 receives the input signal $V_{inm}$. The input signal $V_{inm}$ is a second signal of a differential input signal and is opposite in polarity from the input signal $V_{inp}$ and has the same magnitude as the input signal $V_{inp}$. The coil circuitry 420 includes inductors 422 and 424 connected to the node 428, and the resistor 426. The inductors 422 and 424 are configured similar to the inductors 212 and 214 of FIG. 2A, respectively, and the resistor 426 is configured similar to the resistor 216 of FIG. 2A.

The output of the coil circuitry 420 is electrically connected to the capacitor network circuitry 440. The capacitor network circuitry 440 includes capacitor 442 electrically connected to the node 468 via the switch 443 and to the node 417 via the switch 445. Further, the capacitor network circuitry 440 includes the capacitor 444 that is electrically connected to the node 448 and to the node 417 via the switch 447 and the node 468 via the switch 446. In one or more examples, the capacitors 442 and 444 are capacitor arrays configured similar to the capacitor arrays 222' and 224' of FIG. 2B. Further, the switches 443, 445, 446, and 447 are configured similar to the switches 223, 225, 226, and 227 of FIGS. 2A and 2B, respectively.

The output of the capacitor network circuitry 440 is electrically connected to the inverter circuitry 460. The inverter circuitry 460 includes transistors 461, 462, and 463, level shifter circuitries 464, 465, and 466, and resistor 467. The level shifter circuitry 465 is electrically connected to the node 468 and the gate of the transistor 461, and drives the gate of the transistor 461 with a level shifted signal that is based on the signal at the node 468.

The level shifter circuitry 466 is electrically connected to the gate of the transistor 463. The level shifter circuitry 466 receives the voltage signal $V_{1P}$ via the node 471 and generates a level shifted signal that is driven onto the gate of the transistor 463. The voltage signal $V_{1N}$ is the voltage signal at the node 458.

The drain of the transistor 462 receives the power supply $V_{supply}$ via the node 472.

The transistors 461, 462, and 463 are configured similar to the transistors 231, 232, and 233 of FIG. 2A, respectively. The transistor 461 is a PMOS transistor, the transistor 462 is an NMOS transistor, and the transistor 463 is an NMOS transistor. The level shifter circuitries 464, 465, and 466 are configured similar to the level shifter circuitries 234, 235, and 236 of FIG. 2A, respectively, and the resistor 467 is configured similar to the resistor 237 of FIG. 2A. The output signal of the inverter circuitry 460 is opposite in polarity from that of the inverter circuitry 450.

The output of the inverter circuitry 460 is electrically connected to the inductor 407. The inductor 407 is configured similar to the inductor 206. The output of the inductor 406 is electrically connected to the ADC circuitry 124. The inductor 407 outputs the output signal outp. The polarity of the output signal outp is opposite from that of the output signal outm.

With further reference to FIG. 2A, in one or more examples, the attenuation circuitry 201 is signal ended. In such an example, the level shifter circuitry 236 further includes attenuation circuitry. For example, the level shifter circuitry 236 includes an attenuation capacitor (e.g., $C_{at}$) that ensures that the signal gain between the signal $V_1$ and the signal at the output of the level shifter circuitry 236 corresponds gain from the signal at node 239 and the signal output by the level shifter circuitry 234. With reference to level shifter 300 of FIG. 3, the capacitor 312 is the attenuation capacitor $C_{at}$, and, with reference to the level shifter 350 of FIG. 3, the capacitor 356 is the attenuation capacitor $C_{at}$. Further, in an example where the attenuation circuitry 201 is single ended, the signal $V_1$ received at the node 241 is the signal at the node 239, such that the level shifter circuitry 236 is driven with the output of the inverter circuitry 230.

Figure 5:
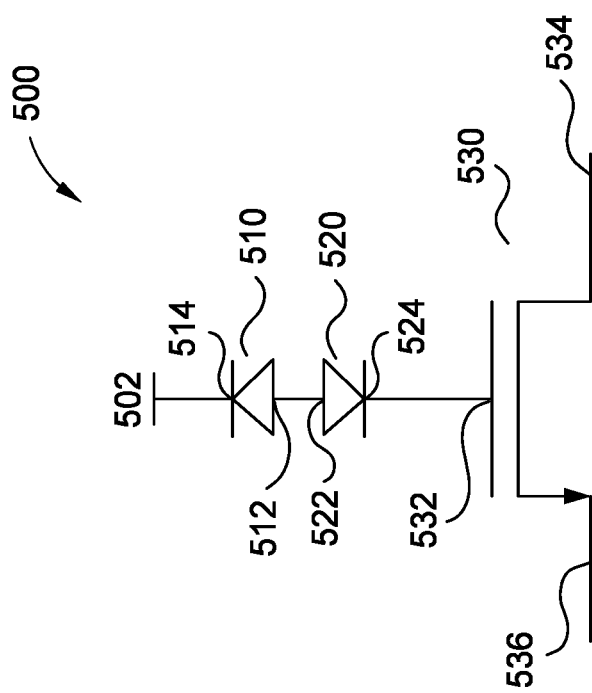
FIG. 5 illustrates a schematic circuit diagram of switching circuitry, according to some examples.

FIG. 5 illustrates a circuit schematic of switching circuitry 500, according to one or more examples. The switching circuitry 500 may be used as the switches 223, 225, 226, 227 of FIG. 2A, and the switches 433, 435, 436, 437, 443, 445, 446, and 447 of FIG. 4. The switching circuitry 500 includes a diode 510, a diode 520, and a transistor 530.

The diode 510 the diode 520, and the transistor 530 are connected in series with each other. The diode 510 is connected between the node 502 and the diode 520. The diode 520 is connected between the diode 510 and the gate node 532 of the transistor 530.

The orientation of the diode 510 is opposite the orientation of the diode 520. For example, the anode node 512 of the diode 510 is connected to the anode node 522 of the diode 520. Further, the cathode node 514 of the diode 510 is connected to the node 502, and the cathode node 524 of the diode 520 is connected to the gate node 532. The transistor 530 is an NMOS transistor having the gate node 532, the drain node 534 and the source node 536. The diodes 510 and 520 are configured in a cutoff (e.g., weak inversion) region, and provide a large resistance at the gate node 532. For example, the diodes 510 and 520 provide a resistance of at least a mega ohm.

Figure 6:
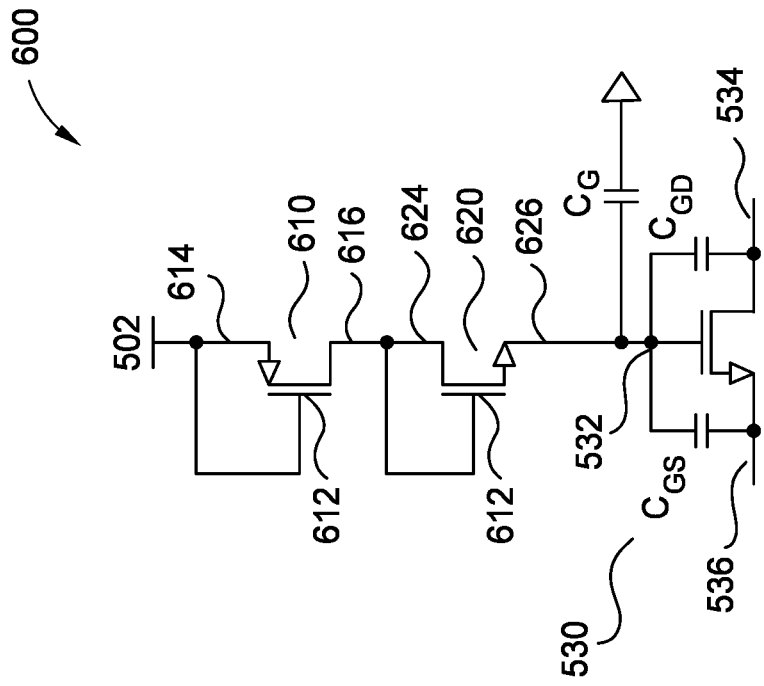
FIG. 6 illustrates a schematic circuit diagram of switching circuitry, according to some examples.

FIG. 6 illustrates a circuit schematic of switching circuitry 600, according to one or more examples. The switching circuitry 600 is configured similar to that of the switching circuitry 500 of FIG. 5. In the switching circuitry 600, the diodes 510 and 520 of FIG. 5 are replaced with transistors 610 and 620. The transistor 610 is a PMOS transistor and the transistor 620 is an NMOS transistor. The transistors 610 and 620 are diode-connected transistors. For example, the source node 614 of the transistor 610 is connected to the gate node 612 of the transistor 610. Further, the drain node 624 of the transistor 620 is connected to the gate node 622 of the transistor 620. The drain node 616 of the transistor 610 is further connected to the drain node 624 of the transistor 620. The source node 626 of the transistor 620 is connected to the gate node 532 of the transistor 530. The transistors 610 and 620 function as diodes (e.g., the diodes 510 and 520, respectively) providing a large resistance at the gate node 532. For example, the transistors 610 and 620 provide a resistance of at least a mega ohm.

In one or more examples, the capacitance $C_{GS}$ is formed between the source node 536 and the gate node 532 of the transistor 530, the capacitance $C_{GD}$ is formed between the drain node 534 and the gate node 532 of the transistor 530, and the capacitance $C_G$ is formed between the gate node 532 and a ground voltage node.

In one or more examples, the linearity of the switching circuitry 600 is increased by reducing the capacitance $C_G$. In one example, the voltage between source node 536 and gate node 532 (or between drain node 534 and gate node 532) when an input signal $V_{in}$ is applied to the source node 536 is $V_B + V_{in}*C_G/(C_G+C_{GS}+C_{GD})$. $V_B$ is the bootstrapped DC voltage. In one or more examples, $V_B$ is $|V_{GS}|$ or $|V_{GD}|$ of the switching circuitry 600 when the switching circuitry 600 is in an "on" state. In order to turn the switching circuitry 600 "on", an appropriate value of $V_B$, based on reliability of the switching circuitry 600, is chosen and applied to the node 502. In one example, to turn "off" the switching circuitry 600 (e.g., place in an "off" state), an appropriate voltage is applied to the node 502 such that the transistor 530 is placed in a cutoff mode (e.g., otherwise turned off). Further, the second term ($V_{in}*C_G/(C_G+C_{GS}+C_{GD})$) is signal dependent based on the value of $C_G$, which may create non-linearity within the switching circuitry 600. Reducing $C_G$, mitigates non-linearities within the switching circuitry 600. In one or more examples, the transistors 610 and 620 reduce the value of $C_G$, mitigating non-linearities within the switching circuitry 600. Further, as the gate current of the transistors 610 and 620 is less than the channel leakage, the voltage drop between the voltage at node 502 and the voltage at gate node 532 is reduced. In one or more examples, adjusting the voltage at node 502 adjusts (e.g., increases or decreases) the voltage difference between the voltage at node 502 and the voltage at the gate node 532.

In one or more examples, the voltage at node 502 is selected to increase the voltage $V_{GS}$ (e.g., voltage between gate node 532 and source node 536), and the voltage $V_{GD}$ (e.g., the voltage between the gate node 532 and the drain node 534), increasing the linearity of the switching circuitry 600. In one or more examples, the transistors 530, 610 and 620 are metal-oxide-semiconductor (MOS) transistors. Accordingly, in a complementary metal-oxide semiconductor (CMOS) technology the transistors 530, 610, and 620 have a small circuit area with a reduced junction capacitance. In a wideband attenuator (e.g., the attenuator circuitry 122 of FIG. 1), parameters including transistors having a reduced junction capacitance and less channel resistance improves the performance of the wideband attenuator.

In one or more examples, the combined resistance of the transistor 610 and the transistor 620 (and the diodes 510 and 520) is represented by $R_G$. To increase the linearity of the switching circuitry 600 (and the switching circuitry 500), $R_G$ is determined based on the capacitances $C_{GD}$ and $C_{GS}$, and the frequency of an input signal $V_{in}$ (e.g., signal at source node 536 of the transistor 530). For example $R_G$ is determined from $1/(2*\pi*(C_{GS}+C_{GD})*F_{in})$. In one example, for an input signal having a frequency ($F_{in}$) of 10 MHz, and a $C_{GS}\pm C_{GD}$ of 125 fF, $R_G$ is at least 160 kiloohm.

In a CMOS technology, implementing high resistance resistors, e.g., resistors having a resistance of greater than about 100 kiloohm is difficult. For example, for discrete resistors having a high resistance (e.g., greater than about 100 kiloohm) the circuit area requirements is prohibitively high, increasing the cost and complexity of the corresponding switching circuit. However, using the diodes 510 and 520, or the diode-connected transistors 610 and 620, provides a high resistance value (e.g., a resistance greater than about 100 kiloohm) with a small circuit area and reduced complexity, as compared to using discrete resistors.

In an example, wherein the switching circuitry 600 is implemented as the switch as the switches 223, 225, 226, 227 of FIG. 2A, and the switches 433, 435, 436, 437, 443, 445, 446, and 447 of FIG. 4, the source node 536 of the transistor 530 is connected to the capacitor 222, 432, and/or 442, and the drain node 534 of the transistor 530 is connected to the node 238, 458, and/or 468.

Figure 7:
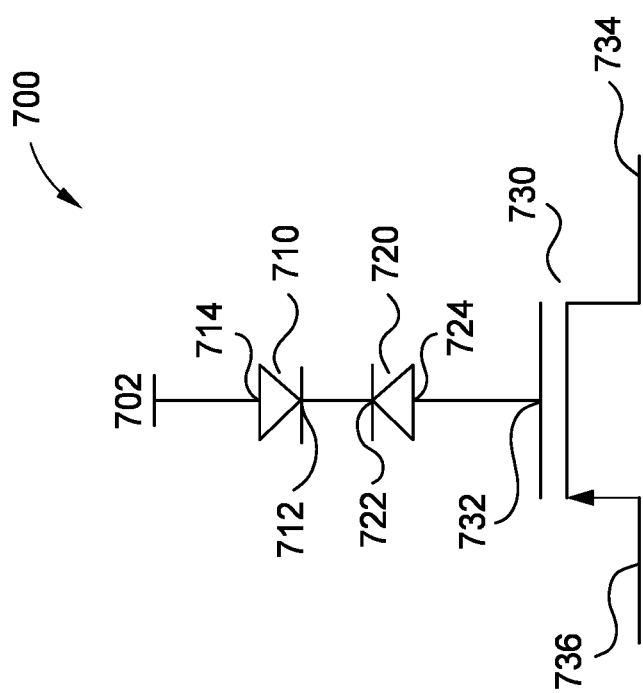
FIG. 7 illustrates a schematic circuit diagram of switching circuitry, according to some examples.

FIG. 7 illustrates switching circuitry 700, according to one or more examples. The switching circuitry 700 is configured similar to the switching circuitry 500. For example, as with the switching circuitry 500, the switching circuitry 700 includes two diodes, e.g., diodes 710 and 720, serially connected to a transistor (e.g., transistor 730). However, as the anode nodes 512 and 522 of the diodes 510 and 520 of the switching circuitry 500 are connected to each other, in the switching circuitry 700, the cathode nodes 712 and 722 of the diodes 710 and 720 are connected to each other. Further, while the transistor 530 of the switching circuitry 500 is an NMOS transistor, the transistor 730 of the switching circuitry 700 is a PMOS transistor.

The diode 710 includes the anode node 714 electrically connected to the node 702, and the cathode node 712 is electrically connected to the cathode node 722 of the diode 720. The anode node 724 of the diode 720 is electrically connected to the gate node 732 of the transistor 730. Further, the transistor 730 includes source node 736 and drain node 734. As is described with regard to diodes 510 and 520 of FIG. 5, the diodes 710 and 720 provide a resistance of at least about 1 mega ohm, increasing the linearity of the switching circuitry 700.

Figure 8:
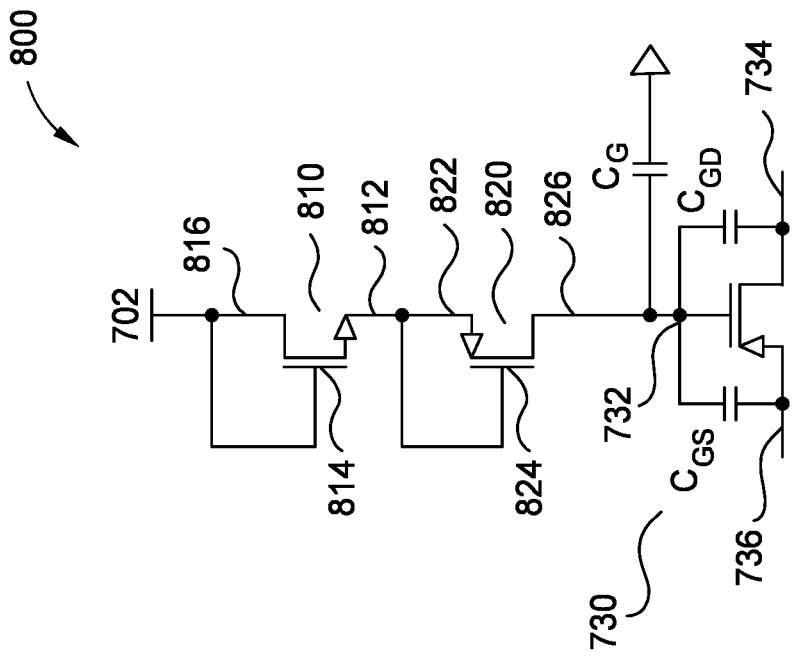
FIG. 8 illustrates a schematic circuit diagram of switching circuitry, according to some examples.

FIG. 8 illustrates a circuit diagram of the switching circuitry 800, according to one or more examples. The switching circuitry 800 is configured similar to the switching circuitry 700 of FIG. 7. In the switching circuitry 800, the diodes 710 and 720 of the switching circuitry 700 are formed using transistors 810 and 820.

The transistor 810 is an NMOS transistor and includes source node 812, gate node 814, and drain node 816. The drain node 816 is electrically connected to the gate node 814, configuring the transistor 810 as a diode-connected transistor. The transistor 820 is a PMOS transistor and includes the source node 822, the gate node 824, and the drain node 826. The source node 822 is connected to the gate node 824, configuring the transistor 820 as a diode-connected transistor. Further, the source node 812 of the transistor 810 is connected to the source node 822 of the transistor 820. The drain node 826 of the transistor 820 is connected to the gate node 732 of the transistor 730.

As is illustrated in FIG. 6 with regard to the transistor 530, the capacitance $C_G$ is formed between the gate node 732 and a ground voltage node. Further, the capacitance $C_{GS}$ is formed between the gate node 732 and the source node 736, and the capacitance $C_{GD}$ is formed between the gate node 732 and the drain node 734.

In one example, the voltage between source node 736 and gate node 732 (or between drain node 734 and gate node 732) when an input signal $V_{in}$ is applied to the source node 736 is $V_B+V_{in}*C_G/(C_G+C_{GS}+C_{GD})$. In one or more examples, $V_B$ is $|V_{GS}|/|V_{GD}|$ of the switching circuitry 800 when the switching circuitry 800 is in an "on" state. In order to turn the switching circuitry 800 "on", an appropriate value of $V_B$, based on reliability of the switching circuitry 800, is chosen and applied to the node 702. In one example, to turn "off" the switching circuitry 800 (e.g., place in an "off" state), an appropriate voltage is applied to the node 702 such that the transistor 730 is placed in a cutoff mode (e.g., otherwise turned off).

In an example, wherein the switching circuitry 800 is implemented as the switches 223, 225, 226, 227 of FIG. 2A, and the switches 433, 435, 436, 437, 443, 445, 446, and 447 of FIG. 4, the source node 736 of the transistor 730 is connected to the capacitor 222, 432 and/or 442, and the drain node 734 of the transistor 730 is connected to the node 238, 458, and/or 468.

The switching circuitries 500, 600, 700, and/or 800 may be implemented as the switch 223, 433, and/or 443 of FIG. 2A and FIG. 4. Additionally, or alternatively, the switching circuitries 500, 600, 700, and/or 800 may be implemented as the switch 225, 226, 227, 435, 436, 437, 445, 446, and 447 of FIG. 2A and FIG. 4. In other examples, the switching circuitries 500, 600, 700, and/or 800 are implemented as switches in other attenuation circuitries, or other circuit architectures. For example, FIG. 9 is a circuit illustration of attenuator circuitry 900, according to one or more examples. The attenuator circuitry 900 may be a Pi-attenuator circuitry. The attenuator circuitry 900 includes switches 912, 916, and 920, and resistors 910, 914, and 918. Each of the resistors 910, 914, and 918 is connected to at least one of the switches 912, 916, and 920. To improve the linearity and area efficiency of the attenuator circuitry 900, one or more of the switches 912, 916, and 920 may be implemented as one of the switching circuitries 500, 600, 700, and/or 800.

FIG. 10 is a circuit illustration of attenuator circuitry 1000, according to one or more examples. The attenuator circuitry 1000 may be T-attenuator circuitry. The attenuator circuitry 1000 includes switches 1012, 1016, and 1020, and resistors 1010, 1014, and 1018. Each of the resistors 1010, 1014, and 1018 is connected to at least one of the switches 1012, 1016, and 1020. To improve the linearity and area efficiency of the attenuator circuitry 1000, one or more of the switches 1012, 1016, and 1020 may be implemented as one of the switching circuitries 500, 600, 700, and/or 800.

FIG. 11 is a circuit diagram of attenuator circuitry 1100, according to one or more examples. The attenuator circuitry 1100 may be Hybrid-Attenuator circuitry. The attenuator circuitry 1100 includes switches 1114 and 1120, and resistors 1110, 1112, 1116, and 1118. To improve the linearity and area efficiency of the attenuator circuitry 1100, one or more of the switches 1114 and 1120 may be implemented as one of the switching circuitries 500, 600, 700, and/or 800.

As is described above, a wireless receiver system includes attenuation circuitry that is included within IC chip with ADC circuitry, DDC circuitry, and DSP circuitry. Further, the attenuation circuitry includes coil circuitry, capacitive network circuitry, and inverter circuitry that increases the linearity of and decreases the manufacture cost of the wireless receiver system, as compared wireless receiver systems that employ attenuation circuitry having different architecture. Further, the attenuation circuitry uses a switching circuitry having diode-connected transistors that increase the linearity of the switching circuitry, and the linearity and area efficiency of the attenuation circuitry.

While the foregoing is directed to specific examples, other and further examples may be devised without departing from the basic scope thereof, and the scope thereof is determined by the claims that follow.

What is claimed is:

1. An attenuation circuitry comprising:
an input pin configured to receive an input signal;
coil circuitry electrically connected to the input pin and configured to receive the input signal from the input pin, and output an adjusted signal from the input signal;
capacitor network circuitry comprising:
a first capacitor array having a first variable capacitance and comprising a first plurality of capacitors, wherein each of the first plurality of capacitors is electrically connected to a first node, and electrically connected to a second node and a first voltage node via first one or more switches; and
a second capacitor array having a second variable capacitance and comprising a second plurality of capacitors, wherein each of the second plurality of capacitors is electrically connected to the first node, and electrically connected to the second node and the first voltage node via a second one or more switches, and wherein the capacitor network circuitry is electrically connected to the coil circuitry and configured to receive the adjusted signal from the coil circuitry, and output an attenuated signal from the adjusted signal; and
inverter circuitry electrically connected to the capacitor network circuitry and configured to receive the attenuated signal and generate an output signal from the attenuated signal, wherein the output signal is output from the attenuation circuitry via an output inductor.

2. The attenuation circuitry of claim 1, wherein the coil circuitry comprises:
a first inductor electrically connected between the input pin and a third node;
a second inductor electrically connected to the third node; and
a first resistor electrically connected to the second inductor and a second voltage node.

3. The attenuation circuitry of claim 1, wherein each of the first plurality of capacitors is electrically connected to the second node via a first respective switch of the first one or more switches and the first voltage node via a second respective switch of the first one or more switches, and
wherein each of the second plurality of capacitors is electrically connected to the second node via a first respective switch of the second one or more switches and the first voltage node via a second respective switch of the second one or more switches.

4. The attenuation circuitry of claim 1, wherein the inverter circuitry comprises:
first level shifter circuitry electrically connected to a fourth node;
a first transistor having a gate node electrically connected to the first level shifter circuitry and a drain node electrically connected to a fifth node;
second level shifter circuitry electrically connected to the fourth node;
a second transistor having a gate node electrically connected to the second level shifter circuitry and a drain node electrically connected to the fifth node; and
a feedback resistor electrically connected between fourth node and the fifth node.

5. The attenuation circuitry of claim 4, wherein the inverter circuitry further comprises:
third level shifter circuitry electrically connected to a second voltage node; and
a third transistor having a gate node electrically connected to the third level shifter circuitry, a source node electrically connected to a source node of the first transistor, and a drain node electrically connected to a third voltage node.

6. The attenuation circuitry of claim 5, wherein one of a polarity of a signal at the second voltage node is the same as a polarity of a signal at the fourth node, and the signal at the second voltage node corresponds to a signal at the fifth node and has an opposite polarity of the signal at the fifth node.

7. The attenuation circuitry of claim 1, further comprising switching circuitry electrically connected between the capacitor network circuitry and the inverter circuitry, the switching circuitry comprising:
a first diode-connected transistor electrically connected to a second voltage node;
a second diode-connected transistor electrically connected to the first diode-connected transistor; and
a first transistor having a gate node electrically connected to the second diode-connected transistor.

8. A receiver system comprising:
attenuation circuitry comprising:
an input pin configured to receive an input signal;
coil circuitry electrically connected to the input pin and configured to receive the input signal from the input pin and output an adjusted signal from the input signal;
capacitor network circuitry comprising:
a first capacitor array having a first variable capacitance and comprising a first plurality of capacitors, each of the first plurality of capacitors is electrically connected to a first node, and electrically connected to a second node and a first voltage node via a first one or more switches; and
a second capacitor array having a second variable capacitance and comprising a second plurality of capacitors, wherein each of the second plurality of capacitors is electrically connected to the first node, and electrically connected to the second node and the first voltage node via a second one or more switches, and wherein the capacitor network circuitry is electrically connected to the coil circuitry and configured to receive the adjusted signal from the coil circuitry, and output an attenuated signal from the adjusted signal; and
inverter circuitry electrically connected to the capacitor network circuitry and configured to receive the attenuated signal and generate an output signal from the attenuated signal, wherein the output signal is output from the attenuation circuitry via an output inductor; and
analog-to-digital converter (ADC) circuitry electrically connected to an output of the attenuation circuitry.

9. The receiver system of claim 8, wherein the attenuation circuitry and the ADC circuitry are formed on a single integrated circuit.

10. The receiver system of claim 8, wherein the coil circuitry comprises:
a first inductor electrically connected between the input pin and a third node;
a second inductor electrically connected to the third node; and
a first resistor electrically connected to the second inductor and a second voltage node.

11. The receiver system of claim 8, wherein each of the first plurality of capacitors is electrically connected to the second node via a first respective switch of the first one or more switches and the first voltage node via a second respective switch of the first one or more switches, and
wherein each of the second plurality of capacitors is electrically connected to the second node via a first respective switch of the second one or more switches and the first voltage node via a second respective switch of the second one or more switches.

12. The receiver system of claim 8, wherein the inverter circuitry comprises:
first level shifter circuitry electrically connected to a fourth node;
a first transistor having a gate node electrically connected to the first level shifter circuitry and a drain node electrically connected to a fifth node;
second level shifter circuitry electrically connected to the fourth node;
a second transistor having a gate node electrically connected to the second level shifter circuitry and a drain node electrically connected to the fifth node; and
a feedback resistor electrically connected between fourth node and the fifth node.

13. The receiver system of claim 12, wherein the inverter circuitry further comprises:
third level shifter circuitry electrically connected to a second voltage node; and
a third transistor having a gate node electrically connected to the third level shifter circuitry, a source node electrically connected to a source node of the first transistor, and a drain node electrically connected to a third voltage node, and wherein a polarity of a signal at the second voltage node, and a polarity of a signal at the fourth node are opposite each other.

14. The receiver system of claim 13, wherein the third level shifter circuitry comprises an attenuation capacitor, and a signal at the second voltage node corresponds to a signal at the fifth node and has the same polarity as the signal at the fifth node.

15. The receiver system of claim 8, wherein a magnitude of the output signal is within a dynamic range of the ADC circuitry, and wherein the ADC circuitry is configured to output a digital signal based on the output signal received from the attenuation circuitry.

16. A differential attenuation circuitry, the differential attenuation circuitry comprising:
a first path comprising:
a first input pin configured to receive a first signal of a differential input signal;
first coil circuitry electrically connected to the first input pin and configured to output a first adjusted signal;
first capacitor network circuitry comprises:
a first capacitor array having a first variable capacitance and comprising a first plurality of capacitors, wherein each of the first plurality of capacitors is electrically connected to a first node, and electrically connected to a second node and a first voltage node via a first one or more switches; and
a second capacitor array having a second variable capacitance and comprising a second plurality of capacitors, wherein each of the second plurality of capacitors is electrically connected to the first node, and electrically connected to the second node and the first voltage node via a second one or more switches, and wherein the first capacitor network circuitry is electrically connected to the first coil circuitry and configured to output a first attenuated; and
first inverter circuitry electrically connected to the first capacitor network circuitry and configured to generate a first output signal via a first inductor; and
a second path comprising:
a second input pin configured to receive a second signal of the differential input signal;
second coil circuitry electrically connected to the second input pin and configured to output a second adjusted signal;

second capacitor network circuitry electrically connected to the second coil circuitry and configured to output a second attenuated signal; and second inverter circuitry electrically connected to the second capacitor network circuitry and configured to generate a second output signal via a second inductor, wherein the first output signal and the second output signal are part of a differential output signal.

17. The differential attenuation circuitry of claim 16, wherein the first coil circuitry comprises:
a third inductor electrically connected between the first input pin and a third node;
a fourth inductor electrically connected to third first node; and
a first resistor electrically connected to the fourth inductor and a second voltage node, and wherein the second coil circuitry comprises:
a fifth inductor electrically connected between the second input pin and a fourth node;
a sixth inductor electrically connected to the fourth node; and
a second resistor electrically connected to the sixth inductor and the second voltage node.

18. The differential attenuation circuitry of claim 16, wherein each of the first plurality of capacitors is electrically connected to the second node via a first respective switch of the first one or more switches and the first voltage node via a second respective switch of the first one or more switches, and
wherein each of the second plurality of capacitors is electrically connected to the second node via a first respective switch of the second one or more switches and the first voltage node via a second respective switch of the second one or more switches, and wherein the second capacitor network circuitry comprises:
a third capacitor array comprising a third plurality of capacitors, each of the third plurality of capacitors is electrically connected to a fifth node and electrically connected to a sixth node via a first respective switch of a third one or more switches and the first voltage node via a second respective switch of the third one or more switches; and
a fourth capacitor array comprising a fourth plurality of capacitors, each of the fourth plurality of capacitors is electrically connected to the fifth node and electrically connected to the sixth node via a first respective switch of a fourth one or more switches and the first voltage node via a second respective switch of the fourth one or more switches.

19. The differential attenuation circuitry of claim 16, wherein the first inverter circuitry comprises:
first level shifter circuitry electrically connected to a seventh node;
a first transistor having a gate node electrically connected to the first level shifter circuitry and a drain node electrically connected to an eighth node;
second level shifter circuitry electrically connected to the seventh node;
a second transistor having a gate node electrically connected to the second level shifter circuitry and a drain node electrically connected to the eighth node; and
a first feedback resistor electrically connected between seventh node and the eighth node, wherein a first output inductor is connected to the eighth node and outputs the first output signal, and wherein the second inverter circuitry comprises:
third level shifter circuitry electrically connected to a ninth node;
a third transistor having a gate node electrically connected to the third level shifter circuitry, and a drain node electrically connected to a tenth node;
fourth level shifter circuitry electrically connected to the ninth node;
a fourth transistor having a gate node electrically connected to the fourth level shifter circuitry and a drain node electrically connected to the tenth node; and
a second feedback resistor electrically connected between ninth node and the tenth node, wherein a second output inductor is connected to the tenth node and outputs the second output signal.

20. The differential attenuation circuitry of claim 19, wherein the first inverter circuitry further comprises:
fifth level shifter circuitry electrically connected to a third voltage node, the third voltage node is connected to the ninth node; and
a fifth transistor having a gate node electrically connected to the fifth level shifter circuitry, and a source node electrically connected to a source node of the first transistor, and wherein the second inverter circuitry further comprises:
sixth level shifter circuitry electrically connected to a fourth voltage node, the fourth voltage node is connected to the seventh node; and
a sixth transistor having a gate node electrically connected to the sixth level shifter circuitry, and a source node electrically connected to the source node of the third transistor.

* * * * *